(12) United States Patent
Kenkare et al.

(10) Patent No.: US 7,542,369 B2
(45) Date of Patent: Jun. 2, 2009

(54) INTEGRATED CIRCUIT HAVING A MEMORY WITH LOW VOLTAGE READ/WRITE OPERATION

(75) Inventors: Prashant U. Kenkare, Austin, TX (US); Andrew C. Russell, Austin, TX (US); David R. Bearden, Austin, TX (US); James D. Burnett, Austin, TX (US); Troy L. Cooper, Austin, TX (US); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/863,961

(22) Filed: Sep. 28, 2007

(65) Prior Publication Data

US 2008/0019206 A1    Jan. 24, 2008

Related U.S. Application Data

(62) Division of application No. 11/427,610, filed on Jun. 29, 2006, now Pat. No. 7,292,495.

(51) Int. Cl.
*G11C 11/00* (2006.01)
(52) U.S. Cl. .................................. 365/226; 365/189.09
(58) Field of Classification Search ............ 365/189.09, 365/226
See application file for complete search history.

(56) References Cited

U.S. PATENT DOCUMENTS

| | | | |
|---|---|---|---|
| 5,420,798 A | 5/1995 | Lin et al. | |
| 5,436,513 A | 7/1995 | Kaye et al. | |
| 6,522,161 B2 | 2/2003 | Lunde et al. | |
| 6,552,357 B2 | 4/2003 | Akita | |
| 6,597,620 B1 | 7/2003 | McMinn | |
| 6,628,552 B1 | 9/2003 | Larsen et al. | |
| 6,738,292 B2 | 5/2004 | Shioyama | |

(Continued)

OTHER PUBLICATIONS

International Search Report and Written Opinion related to PCT/US 07/66908, Applicant's file reference NC10049TC, dated Mar. 21, 2008.
Zhang, et al., "A 3-GHz 70-Mb SRAM in 65-nm CMOS Technology With Integrated Column-Based Dynamic Power Supply," IEEE Journal of Solid-State Circuits, vol. 41, No. 1 Jan. 2006, pp. 146-151.

*Primary Examiner*—Michael T Tran
(74) *Attorney, Agent, or Firm*—Daniel D. Hill

(57) ABSTRACT

An integrated circuit with a low voltage read/write operation is provided. The integrated circuit may include a processor and a plurality of memory cells organized in rows and columns and coupled to the processor, wherein a row of memory cells comprises a word line and all of the memory cells coupled to the word line, and wherein a column of memory cells comprises a bit line and all of the memory cells coupled to the bit line. The integrated circuit may further include a first power supply voltage terminal for receiving a first power supply voltage, wherein the first power supply voltage is provided to power the processor, and wherein the first power supply voltage is provided to power the plurality of memory cells during a first access operation of the plurality of memory cells. The integrated circuit may further include a second power supply voltage terminal for receiving a second power supply voltage higher than the first power supply voltage, wherein the second power supply voltage is provided to power the plurality of memory cells during a second access operation of the plurality of memory cells.

17 Claims, 4 Drawing Sheets

U.S. PATENT DOCUMENTS

| | | |
|---|---|---|
| 6,781,904 B2 | 8/2004 | Lee et al. |
| 6,809,538 B1 | 10/2004 | Borkar |
| 7,126,868 B2 | 10/2006 | Mizuno et al. |
| 2001/0001598 A1 | 5/2001 | Narui et al. |
| 2002/0159309 A1* | 10/2002 | Yamanaka .................. 365/200 |
| 2002/0171101 A1* | 11/2002 | Hsu et al. .................. 257/314 |
| 2003/0031066 A1 | 2/2003 | Yanagisawa et al. |
| 2004/0042275 A1 | 3/2004 | Yoshizawa et al. |
| 2004/0130930 A1 | 7/2004 | Houston |
| 2004/0202023 A1* | 10/2004 | Chen et al. ............. 365/185.21 |
| 2004/0237010 A1 | 11/2004 | Auclair et al. |
| 2005/0024917 A1 | 2/2005 | Yamaoka et al. |
| 2005/0128838 A1 | 6/2005 | Otani et al. |
| 2005/0160217 A1* | 7/2005 | Gonzalez et al. ................ 711/6 |
| 2005/0286193 A1 | 12/2005 | Alokby |
| 2006/0018160 A1 | 1/2006 | Moogat et al. |
| 2006/0056229 A1 | 3/2006 | Maeda et al. |
| 2006/0128348 A1 | 6/2006 | Jang |

* cited by examiner

INTEGRATED CIRCUIT HAVING A MEMORY WITH LOW VOLTAGE READ/WRITE OPERATION

This is a divisional of U.S. patent application Ser. No. 11/427,610, filed on Jun. 29, 2006 now U.S. Pat. No. 7,292,495, entitled, "INTEGRATED CIRCUIT HAVING A MEMORY WITH LOW VOLTAGE READ/WRITE OPERATION" and assigned to the assignee hereof.

BACKGROUND OF THE INVENTION

1. Field of the Invention

This invention relates in general to circuits and more specifically to an integrated circuit having a memory with low voltage read/write operation.

2. Description of the Related Art

Increasingly, newer generations of integrated circuits are using a lower supply voltage to reduce power consumption. The lower supply voltage when used to read/write a memory included in the integrated circuit, however, degrades the performance of memory bitcells. By way of example, the lower supply voltage results in a lower read/write margin for the bitcells. To maintain the read/write margin, conventionally, circuit designers have been forced to use a higher supply voltage. In other words, the minimum supply voltage required by the bitcell to have an acceptable read/write margin becomes the supply voltage for the entire integrated circuit resulting in higher power consumption.

A lower supply voltage can be used with the integrated circuit if the bitcell read/write margins can be improved. Typically, the bitcell read/write margin can be improved by increasing the size of the bitcell. This, however, increases the area consumed by the bitcells and in turn the area occupied by the memory increases, as well.

Thus, there is a need for an integrated circuit having a memory with low voltage read/write operation without increasing the size of the bitcell.

BRIEF DESCRIPTION OF THE DRAWINGS

The present invention may be better understood, and its numerous objects, features, and advantages made apparent to those skilled in the art by referencing the accompanying drawings.

Figure 1:
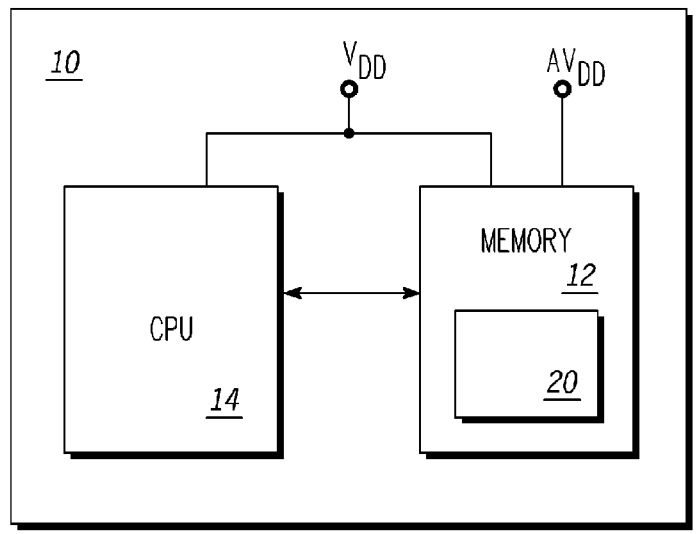
FIG. 1 shows a diagram of an exemplary integrated circuit having a memory, consistent with one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one aspect, an integrated circuit with a low voltage read/write operation is provided. The integrated circuit may include a processor and a plurality of memory cells organized in rows and columns and coupled to the processor, wherein a row of memory cells comprises a word line and all of the memory cells coupled to the word line, and wherein a column of memory cells comprises a bit line and all of the memory cells coupled to the bit line. The integrated circuit may further include a first power supply voltage node for receiving a first power supply voltage and a second power supply node for receiving a second power supply voltage, wherein the first power supply voltage is provided to power the processor, and wherein the first power supply voltage is provided to power either all of the plurality of memory cells or at least one of the plurality of memory cells during a first access operation of the plurality of memory cells, and wherein either the first power supply voltage or the second power supply voltage is provided to power the plurality of memory cells during a second access operation of the plurality of memory cells.

In another aspect, an integrated circuit including a plurality of memory cells organized in rows and columns, each of the plurality of memory cells comprising a power supply voltage node for receiving a memory cell power supply voltage, wherein a row of memory cells comprises a word line and all of the memory cells coupled to the word line, and a column of memory cells comprises true and/or complement bitlines and all of the memory cells coupled to the bit line(s), is provided. The integrated circuit may further include a memory cell power supply multiplexing circuit, coupled to the power supply voltage node of each of the plurality of memory cells, the memory cell power supply multiplexing circuit for providing a first power supply voltage to the power supply voltage node of a selected column of memory cells during a write operation, the memory cell power supply multiplexing circuit for providing a second power supply voltage greater than the first power supply voltage to the power supply voltage node of all of the unselected columns during the write operation. The integrated circuit may further include a discharge circuit, coupled to the power supply voltage node of each of the plurality of memory cells, the discharge circuit for changing a voltage on the memory cell supply voltage terminals of the selected column of memory cells during a first portion of the write operation from the first power supply voltage to a predetermined voltage below the first power supply voltage.

In yet another aspect, a method for accessing an integrated circuit memory is provided. The method may include providing a plurality of memory cells, each of the plurality of memory cells having a power supply voltage node and an access transistor coupled between a storage node and a bit line. The method may further include receiving a first power supply voltage. The method may further include receiving a second power supply voltage, the second power supply voltage being greater than the first power supply voltage. The method may further include selecting the first power supply voltage to provide to the power supply voltage nodes of a selected column of memory cells during a write operation.

The method may further include selecting the second power supply voltage to provide to the power supply voltage nodes of unselected columns of memory cells during the write operation. The method may further include discharging the power supply voltage nodes of the selected column of memory cells from the first power supply voltage to a predetermined voltage below the first power supply voltage during an initial portion of the write operation.

In still another aspect, a method for accessing an integrated circuit memory is provided. The method may include providing a plurality of memory cells, each of the plurality of memory cells having a power supply voltage node and an access transistor coupled between a storage node and a bit line. The method may further include receiving a power supply voltage. The method may further include selecting the power supply voltage to provide to the power supply voltage nodes of a selected column of memory cells during a write operation. The method may further include charging the power supply voltage nodes of the selected column of memory cells from the power supply voltage to a predetermined voltage above the first power supply voltage during an initial portion of the write operation.

Referring now to FIG. 1, FIG. 1 shows a diagram of an exemplary integrated circuit having a memory, consistent with one embodiment of the invention. By way of example, an integrated circuit 10 may include a memory 12 coupled to a CPU 14. Memory 12 and CPU 14 may be supplied a voltage via a $V_{DD}$ voltage terminal. Additionally, memory 12 may be supplied another voltage via an $AV_{DD}$ voltage terminal. The $V_{DD}$ voltage terminal thus may be used to supply an operational voltage for the CPU. The $AV_{DD}$ voltage terminal may be used to supply voltage for at least a portion of memory 12, such as a bitcell array of memory 12. Each bitcell may have a write margin and a read margin and the write margin may be substantially greater than the read margin. By way of example, the bitcells may be static random access memory cells. The $V_{DD}$ voltage terminal may be an external pin or connection for integrated circuit 10. The $AV_{DD}$ voltage terminal may also be another external pin or connection for integrated circuit 10. Alternatively, the $AV_{DD}$ voltage terminal may be internal to integrated circuit 10 and thus the voltage supplied to this terminal may be generated internal to integrated circuit 10. The voltage supplied to the $AV_{DD}$ voltage terminal may be generated using a charge pump, for example. The voltage supplied to the $AV_{DD}$ voltage terminal may also be generated from a phase-locked loop (PLL) voltage connected to a RC network. Other means for generating these voltages may also be used. Additionally, although FIG. 1 shows only one memory and one CPU, integrated circuit 10 may include additional memories and/or CPUs. Further, integrated circuit 10 may include additional components necessary for the operation of integrated circuit 10. Memory 12 may be implemented as a cache. Memory 12 may also be implemented as a stand-alone memory, such as a static-RAM.

Figure 2:
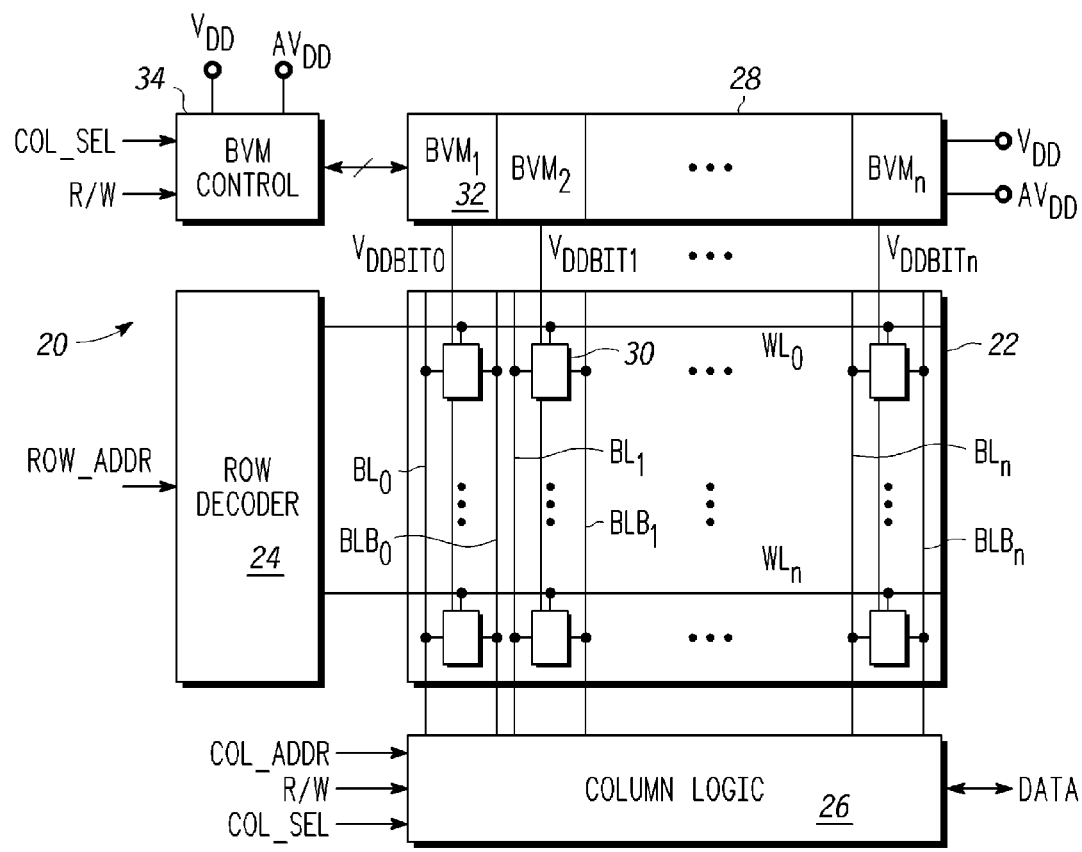
FIG. 2 shows a diagram of an exemplary portion of the memory shown in FIG. 1, consistent with one embodiment of the invention.

FIG. 2 shows a diagram of an exemplary portion of the memory shown in FIG. 1, consistent with one embodiment of the invention. A portion 20 of memory 12 may include a bitcell array 22, a row decoder 24, and a column logic block 26. Row decoder 24 and column logic block 26 may be used to read/write data from/to bitcells, such as bitcell 30 of bitcell array 22. Row decoder 24 may receive a row address (ROW_ADDR) signal from CPU 14, for example. Column logic block 26 may receive various signals, such as column address (COL_ADDR) signal, read/write (R/W) signal, and column select (COL_SEL) signal. Row decoder 24 and column logic block 26 may include additional signals. Column logic block 26 may provide data and/or receive data (DATA) from CPU 14, for example. Bitcell 30 and other similar bitcells of memory portion 20 may be accessed using word lines WL0-WLn and bit lines BL0-BLn and BLB0-BLBn. By way of example, bitcells, such as bitcell 30 may be organized in rows and columns as part of memory portion 20. Each column of bitcells may be coupled to column logic block 26. Each column of bitcells may further be coupled to a bitcell voltage multiplexer (BVM) 32. Thus, there may be as many BVMs 28 as there are columns in memory portion 20. Each BVM 32 may couple a voltage to a corresponding column of bitcells. Thus, for example, BVMs BVM0, BVM1, and BVMn may couple voltages to voltage terminals $V_{DDBIT0}$, $V_{DDBIT1}$, and $V_{DDBITn}$, respectively. Each BVM 32 may further receive the voltages corresponding to the $V_{DD}$ voltage terminal and the $AV_{DD}$ voltage terminal. Each BVM 32 based on control signals may couple either the voltage coupled to the $V_{DD}$ voltage terminal or the voltage coupled to the $AV_{DD}$ voltage terminal to its corresponding $V_{DDBIT}$ terminal. Thus, using BVMs 28 a particular column during a particular operation (such as write operation) may be coupled to the $V_{DD}$ voltage terminal while the other columns may be coupled to the $AV_{DD}$ voltage terminal. Each BVM 32 may receive control signals from a BVM control block 34. BVM control block 34 may also receive the voltages corresponding to the $V_{DD}$ voltage terminal and the $AV_{DD}$ voltage terminal, read/write (R/W) signal, and column select (COL_SEL) signal.

During a write operation, BVMs 28 may be controlled by BVM control 34, such that $V_{DDBIT}$ terminals corresponding to the columns being written are switched to a voltage substantially equal to the voltage being supplied to the processor, i.e., the voltage being supplied to the $V_{DD}$ voltage terminal minus a threshold voltage corresponding to a diode connected p-MOS transistor, whereas the $V_{DDBIT}$ terminals of other columns not being written of bitcell array 22 are coupled to the voltage being supplied to the $AV_{DD}$ voltage terminal. Alternatively, the $V_{DDBIT}$ terminals corresponding to the columns being written may be maintained at the voltage being supplied to the $V_{DD}$ voltage terminal, whereas the $V_{DDBIT}$ terminals of other columns not being written of bitcell array 22 may be switched to the voltage being supplied to the $AV_{DD}$ voltage terminal. It should be noted that columns not selected for writing include bitcells which are coupled to the asserted wordline. In effect, the storage nodes of these bitcells are exposed to precharged bitlines thereby inducing a pseudo-read operation. Hence, switching the $V_{DDBIT}$ terminals to the higher $AV_{DD}$ improves the read margin of these bitcells and their robustness as the processor voltage supply $V_{DD}$ is lowered. During a read operation, the $V_{DDBIT}$ terminals corresponding to all columns of bitcell array 22 may be switched to the voltage being supplied to the $AV_{DD}$ voltage terminal from the voltage being supplied to the $V_{DD}$ voltage terminal. During a standby mode, the $V_{DDBIT}$ terminals corresponding to all columns of bitcell array 22 may be switched to the voltage being supplied to the $V_{DD}$ voltage terminal minus the threshold voltage of a diode connected p-MOS transistor. Those skilled in the art will recognize that the BVM control 34 can be further configured to receive additional input signals that will modify the behavior of BVMs 28 in a manner that differs from the specifics described in this disclosure. For example, the switching of the $V_{DDBIT}$ terminals to the $AV_{DD}$ voltage terminal can be disabled for cases when the processor $V_{DD}$ voltage is above a certain level such that the bitcell is sufficiently robust enough to not require a higher $AV_{DD}$ voltage at its $V_{DDBIT}$ terminal. Alternatively, the switching may be disabled to allow more complete testing of bitcell robustness.

Figure 3:
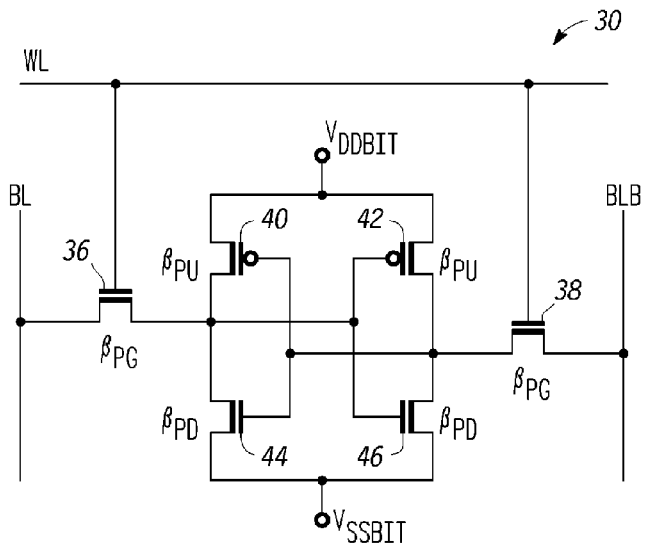
FIG. 3 shows a diagram of an exemplary implementation of a bitcell, consistent with one embodiment of the invention.

FIG. 3 shows a diagram of an exemplary implementation of a bitcell, consistent with one embodiment of the invention.

Exemplary bitcell 30 may be implemented as a six transistor cell. By way of example, as shown in FIG. 3, bitcell 30 may include a pass transistor 36 with one of its current terminals coupled to the bit line BL and its control terminal coupled to the word line WL. Bitcell 30 may further include another pass transistor 38 with one of its current terminals coupled to the bit line BLB and its control terminal coupled to the word line WL. Bitcell 30 may further include a pull up transistor 40 with one of its current terminals coupled to the $V_{DDBIT}$ voltage terminal (the $V_{DDBIT}$ terminal could be any one of the $V_{DDBIT}$ terminals, such as $V_{DDBIT0}$, $V_{DDBIT1}$, and $V_{DDBITn}$). Bitcell 30 may further include another pull up transistor 42 with one of its current terminals coupled to the $V_{DDBIT}$ voltage terminal. Bitcell 30 may further include a pull down transistor 44 with one of its current terminals coupled to the ground voltage $V_{SSBIT}$ terminal. Bitcell 30 may further include another pull down transistor 46 with one of its current terminals coupled to the voltage $V_{SSBIT}$ terminal. Although FIG. 3 shows bitcell 30 implemented using six transistors, bitcell 30 may be implemented using more transistors, for example, using eight transistors.

Since bitcell 30 can receive different supply voltages via the $V_{DDBIT}$ and $V_{SSBIT}$ voltage terminals depending on whether bitcell 30 is being written to or being read from, the conductance of transistors comprising bitcell 30 can be adjusted to achieve better performance. By way of example, during the bitcell read operation the $V_{DDBIT}$ voltage terminal is coupled to the voltage being supplied to the $AV_{DD}$ voltage terminal and during the bitcell write operation the $V_{DDBIT}$ voltage terminal is coupled to the voltage being supplied to the $V_{DD}$ terminal or a threshold voltage below this voltage. By way of example, the conductance of pass transistor 36 $\beta_{PG}$ may be set up relative to the conductance of pull up transistor 40 $\beta_{PU}$ differently depending on whether bitcell 30 is configured to receive the voltage coupled to the $V_{DD}$ voltage terminal or a threshold voltage below this voltage during the write operation. For example, a conductance ratio $\beta_{PG}/\beta_{PU}$ may be increased when bitcell 30 is configured to receive the voltage coupled to the $V_{DD}$ voltage terminal during the write operation. Similarly, a conductance ratio $\beta_{PG}/\beta_{PU}$ corresponding to pass transistor 38 and pull up transistor 42 may also be increased. Conductance of other transistors, such as $\beta_{PD}$ of pull down transistors 44 and 46 may be adjusted, if necessary. For example, the conductance $\beta_{PD}$ of pull down transistors 44 and 46 may be lowered to improve the write margin. This, would, however not affect the read margin too adversely because the coupling of the $V_{DDBIT}$ voltage terminal to the higher $AV_{DD}$ voltage terminal during the read operation results in an improved read margin. In other words, the improvement in read margin by virtue of coupling of the $V_{DDBIT}$ voltage terminal to the higher $AV_{DD}$ voltage terminal during the read operation gives a designer of the bitcell an opportunity to improve the write margin, as well. The conductance values of the transistors may be set in other ways to achieve other benefits. By way of example, by setting the conductance values of the transistors, in some cases the write margin of the memory cells may be made substantially greater than the read margin. For example, the write margin could be made such that it is at least 20% greater than in the case where the write and read margins are balanced. This could be achieved by setting a conductance ratio of the memory cell access transistors relative to the memory cell pull-up transistors. Alternatively, in some instances, the read margin of the memory cells may be made substantially greater than the write margin.

Figure 4:
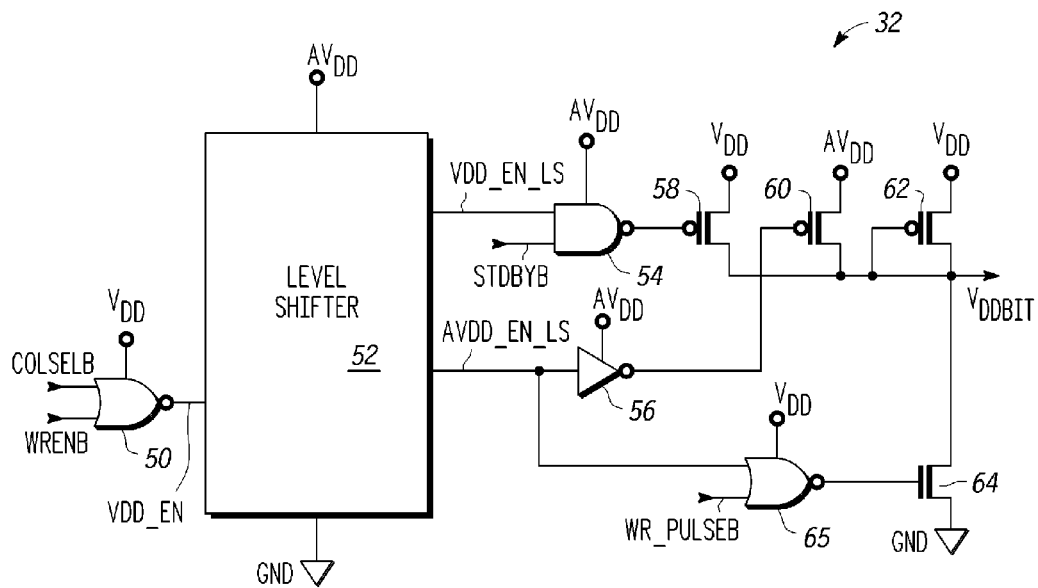
FIG. 4 shows a diagram of an exemplary implementation of a bitcell voltage multiplexer, consistent with one embodiment of the invention.

FIG. 4 shows a diagram of an exemplary implementation of a bitcell voltage multiplexer, consistent with one embodiment of the invention. By way of example, bitcell voltage multiplexer (BVM) 32 may be implemented using a NOR gate 50, a level shifter 52, a NAND gate 54, an inverter 56, p-MOS transistors 58, 60, 62, an n-MOS transistor 64, and a NOR gate 65. NOR gate 50, coupled to the $V_{DD}$ voltage terminal, may receive a column select (COLSELB) signal and a write enable (WRENB) signal. Level shifter 52, coupled to the $AV_{DD}$ voltage terminal, may be used to shift an output of NOR gate 50 from the VDD voltage level to the $AV_{DD}$ voltage level. The level need not be shifted at this stage of signal processing, since it could be done at another stage, for example, as part of BVM control 34. During the write operation, the $V_{DDBIT}$ terminal corresponding to the column being written may be coupled to the $V_{DD}$ voltage terminal, whereas the $V_{DDBIT}$ terminals of other columns not being written of bitcell array 22 may be switched to the $AV_{DD}$ voltage terminal. In terms of operation of BVM 32, during the write operation, signals COLSELB and WRENB are both logic low to select the columns to be written. For this case, NOR gate 50 generates a high VDD_EN signal. Level shifter 52 produces two outputs: VDD_EN_LS, which is generated by level shifting the VDD_EN signal and AVDD_EN_LS signal, which is generated by inverting and level shifting the VDD_EN signal. VDD_EN_LS signal when applied to NAND gate 54 generates a low level signal at the gate of p-MOS transistor 58 and thus the corresponding $V_{DDBIT}$ terminal is connected to the $V_{DD}$ voltage terminal. The signal COLSELB is logic high for those columns not being written; this results in the output of NOR gate 50 generating a low VDD_EN signal. Hence, the $V_{DDBIT}$ terminals corresponding to these columns are switched from the $V_{DD}$ voltage terminal to the $AV_{DD}$ voltage terminal.

Alternatively, during the write operation, the $V_{DDBIT}$ terminal corresponding to the column being written is switched to a voltage substantially equal to a voltage at the $V_{DD}$ voltage terminal minus a threshold voltage corresponding to a diode connected p-MOS transistor 62, whereas the $V_{DDBIT}$ terminals of other columns of bitcell array 22 are coupled to the $AV_{DD}$ voltage terminal. This may be accomplished by asserting a low standby STDBYB signal at the other input of NAND gate 54 resulting in a high signal at the output of NAND gate 54, which in turn would switch transistor 58 off. Referring still to FIG. 4, as part of the write operation when the $V_{DDBIT}$ terminal corresponding to the column being written is switched to a voltage substantially equal to a voltage coupled to the $V_{DD}$ voltage terminal minus a threshold voltage corresponding to diode connected p-MOS transistor 62, n-MOS transistor 64 coupled to ground may be turned on to discharge the voltage at the $V_{DDBIT}$ terminal, such that the transition from the original voltage (the voltage coupled to the processor and other columns of the memory) to a voltage equal to a voltage coupled to the $V_{DD}$ voltage terminal minus a threshold voltage corresponding to diode connected p-MOS transistor 62 is made faster than otherwise possible through bitcell leakage. By way of example, n-MOS transistor 64 may receive its gate signal from an output of NOR gate 65, which in turn may receive the AVDD_EN_LS signal and a write pulse (WR_PULSEB) signal. The output of NOR gate 65 remains asserted for a predetermined amount of time during which n-MOS transistor 64 remains conducting. Those skilled in the art will recognize that the precise voltage-level of the output of NOR gate 65 will determine the rate at which the $V_{DDBIT}$ terminal is pulled down and that the pulse width of the output will determine the amount by which the $V_{DDBIT}$ voltage is decreased. Hence, the voltage-level or duration of the signal coupled to the gate of n-MOS transistor 64 may be varied consistent with the embodiments of the invention. The duration of time for which NOR gate 65 should remain asserted will depend on characteristics such as the capacitance of the $V_{DDBIT}$ terminal and the conductance of n-MOS transistor 64. These characteristics are subject to manufacturing process variation, and hence, an embodiment would include the addition of external trimming signals that can adjust the pulse width after the integrated circuit has been fabricated.

With continued reference to FIG. 4, during the read operation, the $V_{DDBIT}$ terminals corresponding to all columns of bitcell array 22 may be switched to the voltage coupled to the $AV_{DD}$ voltage terminal from the voltage coupled to the $V_{DD}$ voltage terminal. By way of example, this could be accomplished by making signal WRENB high (corresponding to a read operation) and thus by making NOR gate 50 generate a low VDD_EN signal, thus in turn making the AVDD_EN_LS signal high. The high AVDD_EN_LS signal when inverted by inverter 56 would turn on transistor 60 resulting in the corresponding $V_{DDBIT}$ terminal switching to the voltage coupled to the $AV_{DD}$ voltage terminal. Thus, transistor 60 may act as a boosting circuit to boost the voltage coupled to a particular column. Each BVM 32 may, during the read operation, perform this boosting operation, as explained with reference to one of the BVMs.

During the standby mode, the $V_{DDBIT}$ terminals corresponding to all columns of bitcell array 22 may be switched to the voltage coupled to the $V_{DD}$ voltage terminal minus the threshold voltage of diode connected p-MOS transistor 62. This is because asserting a low standby STDBYB signal at the other input of NAND gate 54 would result in a high signal at the output of NAND gate 54, which in turn would switch transistor 58 off, and since transistor 60 is off, the $V_{DDBIT}$ terminal would be switched to a voltage substantially equal to the voltage coupled to the $V_{DD}$ voltage terminal minus a threshold voltage corresponding to diode connected p-MOS transistor 62. Alternatively and/or additionally, during the standby mode, a power supply different from the power supplies coupled to the $V_{DD}$ voltage terminal and the $AV_{DD}$ voltage terminal may be used. Although FIG. 4 shows a specific arrangement of components for obtaining different voltages at the $V_{DDBIT}$ terminals, other arrangement of components may be used to obtain different voltages at the $V_{DDBIT}$ terminals, as well. Those skilled in the art will further recognize that FIG. 4 represents a complete voltage switching solution which encompasses read, write, and standby modes of operation for the memory array. However, it should also be apparent that other voltage switching solutions, which comprise only a portion of the elements illustrated in FIG. 4, may also be implemented consistent with the embodiments of the invention.

Figure 5:
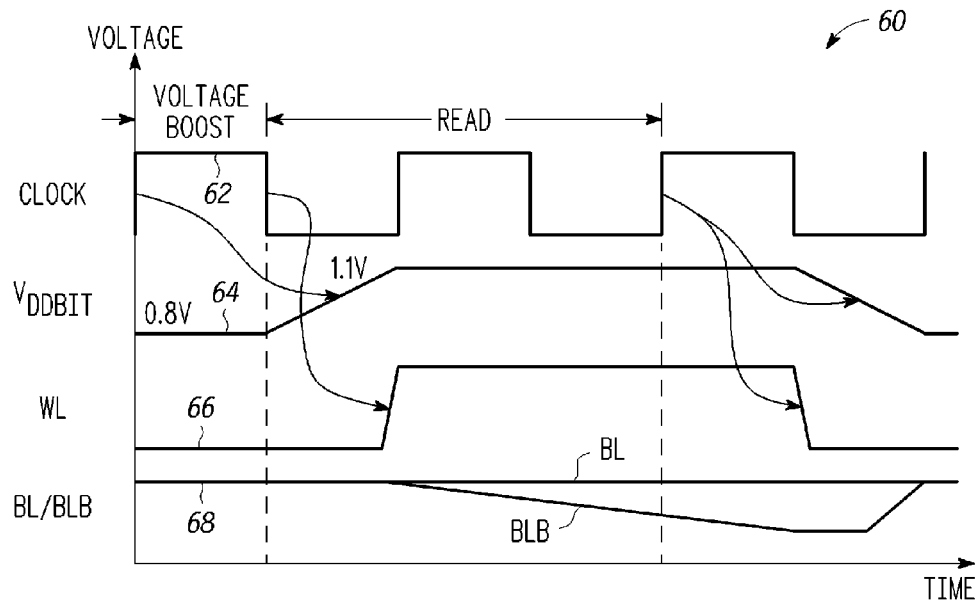
FIG. 5 shows an exemplary timing diagram for a read operation of the bitcell of FIG. 3, consistent with one embodiment of the invention.
Figure 6:
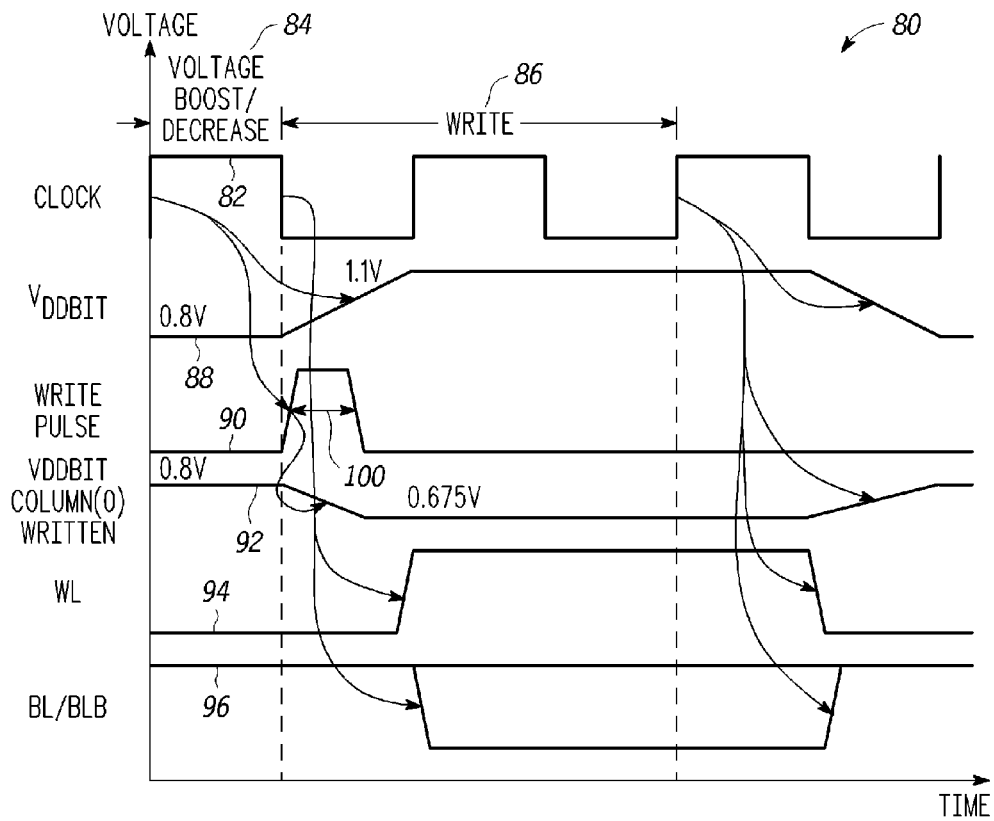
FIG. 6 shows an exemplary timing diagram for a write operation of the bitcell of FIG. 3, consistent with one embodiment of the invention.

FIG. 5 shows an exemplary timing diagram 60 (voltage versus time) for a read operation of the bitcell of FIG. 3, consistent with one embodiment of the invention. As part of operation of bitcell 30, by way of example, a half-cycle of clock 62 may be used to switch the voltage coupled to the $V_{DDBIT}$ terminal from the voltage coupled to the $V_{DD}$ voltage terminal to the voltage coupled to the $AV_{DD}$ voltage terminal. This part of the clock cycle is shown as the VOLTAGE BOOST portion of the clock scheme. Thus, for example, the voltage coupled to the $V_{DDBIT}$ terminal may be switched from 0.8 volts (assuming the voltage coupled to the $V_{DD}$ voltage terminal is set to 0.8 volts) to 1.1 volts (assuming the voltage coupled to the $AV_{DD}$ voltage terminal is set to 1.1 volts). As shown in FIG. 5, a rising edge of clock 62 may be used to trigger the switching of the voltage 64 at the $V_{DDBIT}$ terminal from the voltage coupled to the $V_{DD}$ voltage terminal to the voltage coupled to the $AV_{DD}$ voltage terminal. A falling edge of clock 62 may also be used to assert word line signal WL 66 to perform the read operation. BL/BLB signals 68 may respond accordingly. FIG. 6 shows an exemplary timing diagram 80 (voltage versus time) for a write operation of the bitcell of FIG. 3, consistent with one embodiment of the invention. As part of operation of bitcell 30, a half-cycle of clock 82 may be used to switch the voltage coupled to the $V_{DDBIT}$ terminal from the voltage coupled to the $V_{DD}$ voltage terminal to the voltage coupled to the $AV_{DD}$ voltage terminal. This part of the clock cycle is shown as the VOLTAGE BOOST/DECREASE portion 84 of the clock scheme. Columns selected for writing have their $V_{DDBIT}$ terminal coupled to a voltage at or below the $V_{DD}$ voltage terminal. Unselected columns have their $V_{DDBIT}$ terminal boosted to the $AV_{DD}$ voltage terminal. Thus, for example, the voltage 88 coupled to the $V_{DDBIT}$ terminal may be switched from 0.8 volts (assuming the voltage coupled to the $V_{DD}$ voltage terminal is set to 0.8 volts) to 1.1 volts (assuming the voltage coupled to the $AV_{DD}$ voltage terminal is set to 1.1 volts). During the write operation, a rising edge of clock 82 would also trigger a write pulse (WRITE PULSE) signal 90. The asserted WRITE PULSE signal 90 in turn would switch the voltage coupled to the $V_{DDBIT}$ voltage terminal from the voltage coupled to the $V_{DD}$ voltage terminal to the voltage coupled to the $V_{DD}$ voltage terminal minus the threshold voltage of the diode connected p-MOS transistor (for example, p-MOS transistor 62 of FIG. 4). By way of example, the voltage at the $V_{DDBIT}$ terminal may switch from 0.8 volts to 0.675 volts. A falling edge of clock 82 may also result in word line WL signal 94 being asserted and BL or BLB signals 96 being deasserted based on whether a logic zero or logic 1 is being written into bitcell 30.

Figure 7:
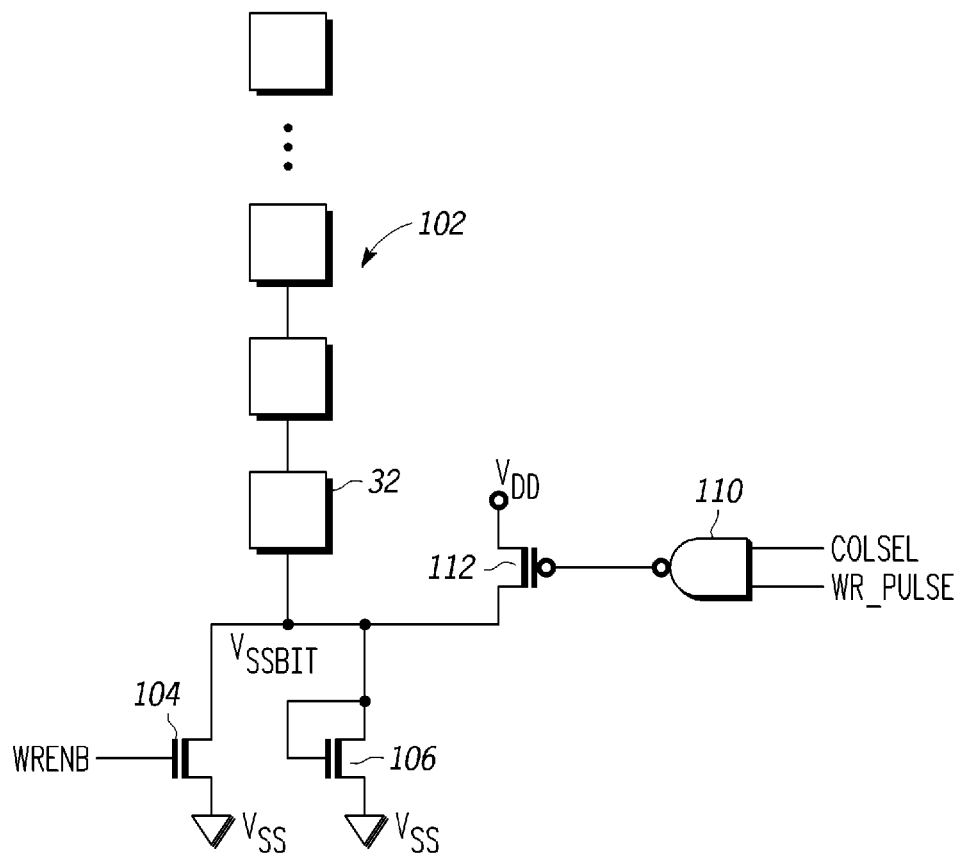
FIG. 7 shows an exemplary circuit for improving a write margin of a bitcell, consistent with one embodiment of the invention.

As shown in FIG. 7, a write margin of bitcell 30 may also be improved by providing a modified ground supply voltage to a $V_{SSBIT}$ terminal. By way of example, during a write operation corresponding to column 102 of bitcells, a write enable (WRENB) signal may turn n-MOS transistor 104 off. This may result in the voltage at the $V_{SSBIT}$ terminal changing to a threshold voltage of n-MOS transistor 106. The voltage at the $V_{SSBIT}$ terminal may be pulled quickly to the threshold voltage of n-MOS transistor 106 by turning on p-MOS transistor 112 using NAND gate 1 10. NAND gate is shown as receiving signals COLSEL and WR_PULSE. The assertion of signals COLSEL and WR_PULSE would turn on p-MOS transistor 112 and this in turn pulls up the $V_{SSBIT}$ terminal to the threshold voltage of n-MOS transistor 106 faster than otherwise possible through bitcell leakage. The output of NAND gate 110 remains deasserted for a predetermined amount of time during which p-MOS transistor 112 remains conducting. Those skilled in the art will recognize that the precise voltage-level of the output of NAND gate 110 will determine the rate at which the $V_{SSBIT}$ terminal is pulled up and that the pulse width of the output will determine the amount by which the $V_{SSBIT}$ voltage is increased. Hence, consistent with embodiments of the invention one may vary the voltage-level or duration of the signal coupled to the gate of p-MOS transistor 112. The duration of time for which NAND gate 110 should remain deasserted will depend on characteristics such as the capacitance of the $V_{SSBIT}$ terminal and the conductance of p-MOS transistor 112. These characteristics are subject to manufacturing process variation, and hence, one embodiment would include the addition of external trimming signals that can adjust the pulse width after the integrated circuit has been fabricated. Although FIG. 7 shows a specific arrangement of components for obtaining a higher voltage than ground (substantially zero voltage) at the $V_{SSBIT}$ terminal, other arrangement of components may be used to obtain the higher voltage at the $V_{SSBIT}$ terminal. It should be noted that the signal WRENB in FIG. 7 can be deasserted in standby mode such that the leakage of bitcells in column 102 is curtailed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit, comprising:
a plurality of memory cells organized in rows and columns, each of the plurality of memory cells comprising a power supply voltage node for receiving a memory cell power supply voltage, wherein a row of memory cells comprises a word line and all of the memory cells coupled to the word line, and a column of memory cells comprises a bit line and all of the memory cells coupled to the bit line;
a discharge circuit, coupled to the power supply voltage node of each of the plurality of memory cells, the discharge circuit for changing a voltage on the power supply voltage nodes of a selected plurality of memory cells during a first portion of a write operation from the first power supply voltage to a predetermined voltage lower than the first power supply voltage; and
a memory cell power supply multiplexing circuit, coupled to the power supply voltage node of each of the plurality of memory cells, the memory cell power supply multiplexing circuit for providing a first power supply voltage to the power supply voltage node of the selected column of memory cells during the write operation, the memory cell power supply multiplexing circuit for providing a second power supply voltage greater than the first power supply voltage to the power supply voltage node of all of the unselected columns during the write operation.

2. The integrated circuit of claim 1 further comprising a voltage boosting circuit, coupled to the power supply voltage node of each of the plurality of memory cells, the voltage boosting circuit for increasing the voltage on the power supply voltage nodes during a read operation of the plurality of memory cells.

3. The integrated circuit of claim 1, wherein the predetermined voltage is equal to the first power supply voltage minus a threshold voltage drop.

4. The integrated circuit of claim 1, wherein each of the plurality of memory cells has a write margin and a read margin, wherein the write margin is substantially greater than the read margin.

5. The integrated circuit of claim 4, wherein the write margin is made substantially greater than the read margin by setting a conductance ratio of the memory cell access transistors relative to the memory cell pull-up transistors.

6. The integrated circuit of claim 1, wherein the memory cell power supply multiplexing circuit is located near a first end of the bit line and a column logic circuit is located near a second end of the bit line.

7. The integrated circuit of claim 1, wherein the plurality of memory cells is characterized as being a plurality of static random access memory cells.

8. The integrated circuit of claim 1, further comprising a processor coupled to receive the second power supply voltage.

9. A method for accessing an integrated circuit memory comprising:
providing a plurality of memory cells, each of the plurality of memory cells having a power supply voltage node and an access transistor coupled between a storage node and a bit line;
receiving a first power supply voltage;
receiving a second power supply voltage, the second power supply voltage being greater than the first power supply voltage;
selecting the first power supply voltage to provide to the power supply voltage nodes of a selected column of memory cells during a write operation;
selecting the second power supply voltage to provide to the power supply voltage nodes of unselected columns of memory cells during the write operation; and
discharging the power supply voltage nodes of the selected column of memory cells from the first power supply voltage to a predetermined voltage below the first power supply voltage during a first portion of the write operation.

10. The method of claim 9, wherein discharging the power supply voltage nodes of the selected column of memory cells is accomplished using a pull-down transistor, and wherein a voltage-level of a signal coupled to the pull-down transistor determines a rate of discharging and an adjustable pulse-width of the signal coupled to the pull-down transistor determines an amount of discharging.

11. The method of claim 9, further comprising selecting the second power supply voltage to provide to the power supply voltage nodes of the plurality of memory cells during a read operation of the integrated circuit memory.

12. The method of claim 9, wherein providing the plurality of memory cells further comprises providing a plurality of static random access memory cells.

13. A method for accessing an integrated circuit memory comprising:
providing a plurality of memory cells, each of the plurality of memory cells having a power supply voltage node and an access transistor coupled between a storage node and a bit line;
receiving a first power supply voltage;
selecting the power supply voltage to provide to the power supply voltage nodes of a selected plurality of memory cells during a write operation; and
charging the power supply voltage nodes of the selected column of memory cells from the power supply voltage to a predetermined voltage above the first power supply voltage during a first portion of the write operation, wherein charging the power supply voltage nodes of the selected column of memory cells is accomplished using a pull-up transistor, and wherein a voltage-level of a signal coupled to the pull-up transistor determines a rate of charging and an adjustable pulse-width of the signal coupled to the pull-up transistor determines an amount of charging.

14. The method of claim 13 wherein the predetermined voltage is equal to a threshold voltage above ground potential.

15. The method of claim 13, wherein a read margin of the plurality of memory cells is made substantially greater than a write margin of the plurality of memory cells by setting a conductance ratio of the memory cell transistors.

16. The method of claim 13, further comprising selecting a second power supply voltage to provide to the power supply voltage nodes of the plurality of memory cells during a read operation of the integrated circuit memory.

17. The method of claim 13, wherein providing the plurality of memory cells further comprises providing a plurality of static random access memory cells.

\* \* \* \* \*